United States Patent
Habu et al.

(10) Patent No.: US 8,141,216 B2
(45) Date of Patent: Mar. 27, 2012

(54) METHOD OF MANUFACTURING ULTRASOUND PROBE

(75) Inventors: Takeshi Habu, Hachioji (JP); Takayuki Sasaki, Hachioji (JP)

(73) Assignee: Konica Minolta Medical & Graphic, Inc. (JP)

( * ) Notice: Subject to any disclaimer, the term of this patent is extended or adjusted under 35 U.S.C. 154(b) by 172 days.

(21) Appl. No.: 12/606,535

(22) Filed: Oct. 27, 2009

(65) Prior Publication Data

US 2010/0043190 A1 Feb. 25, 2010

Related U.S. Application Data

(62) Division of application No. 11/888,580, filed on Aug. 1, 2007, now abandoned.

(30) Foreign Application Priority Data

Aug. 8, 2006 (JP) .................................. 2006-215512

(51) Int. Cl.
*H04R 17/10* (2006.01)
*H01L 41/04* (2006.01)

(52) U.S. Cl. ............. 29/25.35; 29/594; 29/830; 29/831; 156/230; 310/322; 310/334

(58) Field of Classification Search .................. 29/594, 29/25.35, 25.41, 25.42, 830, 831; 156/230, 156/239; 310/312, 322, 334
See application file for complete search history.

(56) References Cited

U.S. PATENT DOCUMENTS 4,564,980 A * 1/1986 Diepers ......................... 29/25.35
7,054,135 B2 * 5/2006 Kuniyasu ................. 29/25.42 X

FOREIGN PATENT DOCUMENTS

| JP | 63-252140 A | 10/1988 |
|----|----|----|
| JP | 2-19984 B2 | 5/1990 |
| JP | 4-214000 A | 8/1992 |
| JP | 5-284761 * | 10/1993 |
| JP | 6-342947 A | 12/1994 |
| JP | 8-187245 A | 7/1996 |
| JP | 11-276478 A | 10/1999 |
| JP | 2001-258879 A | 9/2001 |
| JP | 2002-44785 A | 2/2002 |
| JP | 2005-235878 A | 9/2005 |

OTHER PUBLICATIONS

Machine Language Translation of Japanese Patent Publication JP 2002-044785.*
Notice of Reasons for Refusal for Japanese Patent Application No. 2008-528766, draft Dec. 9, 2011, with English translation.

* cited by examiner

*Primary Examiner* — A. Dexter Tugbang
(74) *Attorney, Agent, or Firm* — Cantor Colburn LLP

(57) ABSTRACT

An ultrasound probe comprising a transmitting piezoelectric layer, an electrode layer and a receiving piezoelectric layer laminated in that order, the ultrasound probe transmitting and receiving an ultrasound, wherein a polarization treatment on the receiving piezoelectric layer is carried out by providing a peelable dielectric layer on the receiving piezoelectric layer.

6 Claims, 1 Drawing Sheet

METHOD OF MANUFACTURING ULTRASOUND PROBE

The present application is a divisional application of U.S. patent application Ser. No. 11/888,580, filed on Aug. 1, 2007, the entire contents of which are incorporated herein by reference. The Ser. No. 11/888,580 application claimed the benefit of the date of the earlier filed Japanese Patent Application No. JP 2006-215512 filed Aug. 8, 2006, the entire content of which is hereby incorporated by reference.

TECHNICAL FIELD

The present invention relates to ultrasound probes used for medical diagnosis and a production method of the same. More particularly, the present invention relates to an ultrasound probe incorporating an improved receiving piezoelectric layer and a production method of the same.

BACKGROUND OF THE INVENTION

An ultrasonic diagnostic apparatus is a medical imaging equipment, which non-invasively obtains tomograms of in vivo soft tissue from the body surface using the ultrasonic pulse reflection method. This ultrasonic diagnostic apparatus is characterized by being small-sized, inexpensive, and highly safe due to no need for exposure to X-rays, compared to other medical imaging equipment, and further, is characterized by enabling blood flow imaging via application of the Doppler effect. Ultrasonic diagnostic apparatuses have been widely used in the circulatory system (coronary artery), the digestive system (stomach and intestines), internal medicine (liver, pancreas, and spleen), the urinary system (kidney and bladder), as well as obstetrics and gynecology. Since ultrasound probes, commonly used in such medical ultrasonic diagnostic apparatuses, transmit and receive ultrasonic waves of high sensitivity and high resolution, wherefore piezoelectric effects exhibited in piezoelectric inorganic materials are generally utilized. In this case, single-type transducers, being a monotype, or array-type transducer formed by positioning a plurality of transducers two-dimensionally are commonly employed to obtain vibration modes for transmitting piezoelectric elements. The array-type transducers capable of obtaining highly detailed images have become widespread in medical imaging applied to diagnostic tests.

On the other hand, harmonic imaging diagnosis using high harmonic signals is becoming the standard diagnostic modality since it is possible to obtain clear diagnostic images, which are not obtainable by conventional B-mode diagnosis. Harmonic imaging has many advantages in comparison with fundamental wave imaging, such as: high contrast resolution stemming from an excellent S/N ratio due to a low sidelobe level, high resolution in the horizontal direction stemming from a narrow beam-width due to high frequency, no occurrence of multiple reflection due to low sound pressure and small sound pressure fluctuation over a short distance, and realization of high depth-speed due to attenuation comparable to that of a fundamental wave at the focal point or deeper, compared to ultrasonic imaging methods using fundamental wave of a high harmonic frequency.

A piezoelectric vibrator is utilized as a specific structure of an array-type ultrasound probe for harmonic imaging, wherein each of the vibrator elements forming an array is broadband-monolithic. A method of transmitting a fundamental wave in the frequency range on the low frequency side and of receiving a high harmonic wave in the frequency range on the high frequency side is commonly utilized, based on the broadband performance of the piezoelectric vibrator. In such a situation, the following technology for increasing sensitivity of the conventional ultrasound probe is known: "a technology for aiming to increase sensitivity by means of vibrating vertically each of fine columnar piezoelectric elements (columnar inorganic materials), wherein vibrators formed by packing the fine columnar piezoelectric elements by use of, for example, an organic compound such as an epoxy resin are employed as ultrasonic transmitting and receiving elements" (refer to Patent Document 1).

Preferably, a narrow-band ultrasonic wave is utilized to prevent the overlap between the spectrums of an ultrasonic wave to transmit a fundamental wave and an ultrasonic wave to receive a high harmonic wave. The narrow-band ultrasonic wave is normally an ultrasonic pulse signal with a long tail, resulting in negatively affecting the resolution in the depth direction.

As a specific structure of other array-type ultrasound probes for harmonic imaging, for example, a separate-type transmitting and receiving transducer has been proposed, wherein each of the transmitting and receiving piezoelectric vibrators is positioned separately, (refer to Patent Documents 2 and 3). Further, it has been proposed that a second piezoelectric layer to receive an ultrasonic wave of a central frequency of $f2=2f1$ is piled on a first piezoelectric layer, wherein the first piezoelectric layer is a piezoelectric layer to transmit and receive an ultrasonic wave with a central frequency of $f1$, composed of an array of plural first piezoelectric elements with a first acoustic impedance, and the second piezoelectric layer incorporates an array of plural second piezoelectric elements exhibiting a second acoustic impedance (refer to Patent Document 3); however, sufficient sensitivity has not yet been obtained.

Further, the following method is applied to increase sensitivity of ultrasonic transmitting and receiving elements: transmitting sensitivity is increased by improving electric matching conditions of piezoelectric inorganic elements with the driving circuit by decreasing the apparent impedance using laminated piezoelectric inorganic elements; and by making large distortion by increasing the electric field intensity applied to the aforesaid elements (refer to Patent Document 5). However, although transmitting sensitivity in a laminated structure is increased according to the number of laminated layers, receiving sensitivity is inversely proportional to the number of the laminated layers, resulting in a disadvantage for harmonic imaging.

The composite vibrators described in above Patent Document 1 are prepared by forming a columnar structure by cutting an inorganic piezoelectric material using a cutter such as a dicer, followed by filling the cut grooves with an organic material such as an epoxy resin. Also in an array-type transducer, a cutter such as a dicer is employed to divide to form the channels.

However, since transmitting and receiving frequencies of an ultrasound probe depend on thickness of the inorganic piezoelectric materials, the higher the frequencies are, the smaller the size of the columnar structure or the pitch of the channel becomes. Therefore, the number of machining processes using a cutter such as a dicer increases, and the mechanical strength of the inorganic piezoelectric materials decreases, whereby it becomes difficult to ignore the degradation in characteristic caused by breakage, as well as heat and distortion during machining, resulting in causing problems of being liable to lower the yield in producing vibrators or probes, and to degrade the performance. Further, in order to prepare a transmitting piezoelectric element compatible with a desired frequency, it is necessary to grind and polish both end-surfaces thereof, which results in an increase of production cost. Thus, there have been problems to be solved in producing an ultrasound probe using an inorganic material, compared to when organic materials are used.

In order to solve the above problems on the conventional technology, there has been proposed a method in which an inorganic material is used as the transmitting piezoelectric element and an organic materials is used as the high sensitivity receiving piezoelectric element, whereby a high sensitivity ultrasound probe is obtained, specifically when an array-type ultrasound probe in which the transmitting operation and the receiving operation are divided is employed. In order to add piezoelectric characteristics to the organic materials, an effective polarization treatment such as high-voltage treatment or high-voltage corona discharge treatment is needed, however, there has been a problem that it is difficult to apply a high voltage to such an organic material due to breakage or dielectric breakdown of the organic materials (organic film layers). A method has been proposed in Patent document 4 to solve this problem, namely, the above organic porous material is sandwiched between dielectric substances, or dielectric oil is injected into the porous holes during polarization treatment of the organic material. The breakdown of the organic material can be avoided by the protection by sandwiching the organic material using the dielectric substances, however, the aforesaid protection causes a decrease in efficiency during polarization treatment, resulting in decrease in sensitivity. Further, use of dielectric oil causes a problem in that it is necessary to wipe off the oil, in order not to cause failure in printing electrodes on the wiped surface during the electrode mounting process. In other words, there has been a problem of requiring extra cost for cleaning.

(Patent Document 1) Japanese Patent Application Publication Open to Public Inspection (hereinafter referred to as JP-A) No. 63-252140
(Patent Document 2) JP-A No. 8-187245
(Patent Document 3) JP-A No. 11-276478
(Patent Document 4) JP-A No. 6-342947
(Patent Document 5) JP-A No. 2005-235878

SUMMARY OF THE INVENTION

An object of the present invention is to provide an ultrasound probe having a transmitting piezoelectric layer and a receiving piezoelectric layer in that order and exhibiting excellent sensitivity, which is obtained by highly, optimally, stably, and inexpensively polarization-treating a receiving piezoelectric layer, specifically, an organic receiving piezoelectric layer, without occurrence of dielectric breakdown, and to provide a method of manufacturing the same by which the ultrasound probe exhibiting excellent sensitivity is manufactured stably in performance, easily, at high yield, and inexpensively.

One of the aspects to achieve the above object of the present invention is an ultrasound probe comprising a transmitting piezoelectric layer, an electrode layer and a receiving piezoelectric layer laminated in that order, the ultrasound probe transmitting and receiving an ultrasound, wherein a polarization treatment on the receiving piezoelectric layer is carried out by providing a peelable dielectric layer on the receiving piezoelectric layer.

DESCRIPTION OF THE PREFERRED EMBODIMENTS

Figure 1:
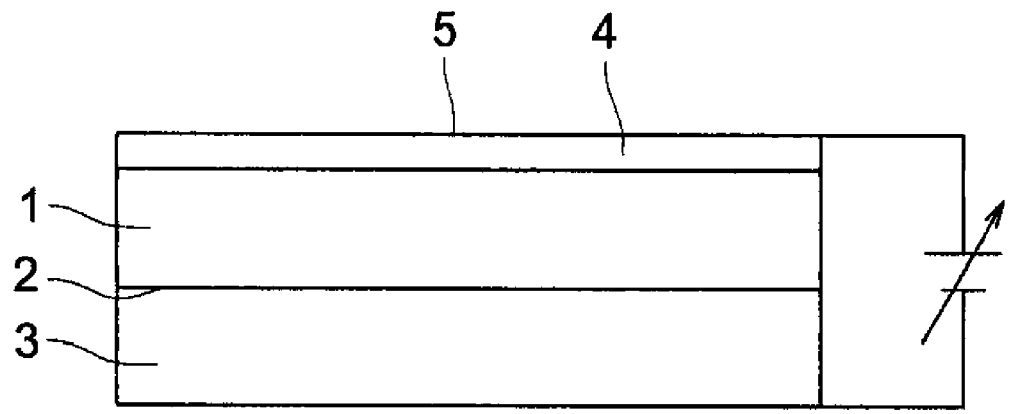
FIG. 1 is a schematic view showing a polarization treatment in which direct or alternating current voltage is applied to a probe having a plurality of layers and provided with a dielectric layer.

The above object of the present invention is achieved by the following structures.
(1) An ultrasound probe comprising a transmitting piezoelectric layer, an electrode layer and a receiving piezoelectric layer laminated in that order, the ultrasound probe transmitting and receiving an ultrasound, wherein
a polarization treatment on the receiving piezoelectric layer is carried out by providing a peelable dielectric layer on the receiving piezoelectric layer.
(2) The ultrasound probe of Item (1), wherein the piezoelectric layer is firmly attached to the receiving piezoelectric layer during the polarization treatment, and the piezoelectric layer is peeled from the receiving piezoelectric layer after the polarization treatment is finished.
(3) The ultrasound probe of Item (1) or (2), wherein the dielectric layer comprises an organic material and inorganic dielectric particles.
(4) The ultrasound probe of Items (3), wherein the inorganic dielectric particles are selected from the group consisting of quartz, $LiNbO_3$, $K(Ta,Nb)O_3$, $BaTiO_3$, $LiTaO_3$ and $SrTiO_3$.
(5) The ultrasound probe of any one of Items (1) to (4), wherein the transmitting piezoelectric layer comprises an inorganic material, and the receiving piezoelectric layer comprises an organic material.
(6) The ultrasound probe of any one of Items (1) to (5), wherein the polarization treatment is a direct current high voltage pulse application at 1 kV/m-1 MV/m or an alternating current high voltage pulse application at 1 kV/m-1 MV/m.
(7) The ultrasound probe of any one of Items (1) to (5), wherein the polarization treatment is a corona discharge treatment.
(8) A method of manufacturing an ultrasound probe comprising the sequential steps of:
laminating an electrode layer on a transmitting piezoelectric layer;
polarizing the transmitting piezoelectric layer;
laminating a receiving piezoelectric layer on the electrode layer;
providing a peelable dielectric layer on the receiving piezoelectric layer;
polarizing the receiving piezoelectric layer; and
peeling the dielectric layer from the receiving piezoelectric layer to obtain the ultrasound probe,
the ultrasound probe transmitting and receiving an ultrasound.
(9) The method of Item (8), wherein the dielectric layer comprises an organic material and inorganic dielectric particles.
(10) The method of Item (9), wherein the inorganic dielectric particles are selected from the group consisting of quartz, $LiNbO_3$, $K(Ta,Nb)O_3$, $BaTiO_3$, $LiTaO_3$ and $SrTiO_3$.
(11) The method of any one of Items (8) to (10), wherein the transmitting piezoelectric layer comprises an inorganic material, and the receiving piezoelectric layer comprises an organic material.
(12) The method of any one of Items (8) to (11), wherein the polarization treatment is a direct current high voltage pulse application at 1 kV/m-1 MV/m or an alternating current high voltage pulse application at 1 kV/m-1 MV/m.

(13) The method of any one of Items (8) to (11), wherein the polarization treatment is a corona discharge treatment.

According to the present invention, an ultrasound probe having a transmitting piezoelectric layer and a receiving piezoelectric layer in that order, and exhibiting excellent sensitivity can be obtained by highly, optimally, stably, and inexpensively polarization-treating a receiving piezoelectric layer, specifically, an organic receiving piezoelectric layer, without occurrence of dielectric breakdown, and also obtained is a method of manufacturing the same by which the ultrasound probe exhibiting excellent sensitivity is manufactured stably in performance, easily, at high yield, and inexpensively.

Preferred embodiments of the present invention will now be described; however the present invention is not limited thereto.

One of the features of the ultrasound probe of the present invention is that it is an ultrasonic transmitting and receiving transducer incorporating a transmitting piezoelectric layer and a receiving piezoelectric layer in this order, wherein polarization treatment is conducted by mounting a peelable dielectric layer on the aforesaid receiving piezoelectric layer.

Preferred embodiments of the present invention are described below, referring to FIGS. 1 and 2.

A schematic view of polarization treatment conducted by applying direct current voltage or alternating current voltage to a multilayered transducer, incorporating a dielectric layer, is shown in FIG. 1. A schematic view of polarization treatment conducted by applying corona discharge to a multilayered transducer, incorporating a dielectric layer, is shown in FIG. 2.

An example of production methods of ultrasound probes in preferred embodiments of the present invention is described below, referring to FIG. 1.

Initially, transmitting piezoelectric layer 3 is prepared.

A separate-type transmitting and receiving piezoelectric element has a laminated structure of receiving piezoelectric layer 1 and transmitting piezoelectric layer 3 having therebetween electrode 2, as shown in FIG. 1. Transmitting piezoelectric layer 3 may be a laminated structure formed by a thin piezoelectric sheet and an electrode layer, as shown in FIG. 1. Such a structure may be prepared, for example, by laminating piezoelectric inorganic green sheets (a green sheet representing a sheet before calcination), on which an electrode has been printed using platinum paste prior to firing, followed by firing together. Examples of a material constituting the electrode layer include: gold, silver, platinum and palladium. It is possible to set any thickness of the green sheets, which are formed into a sheet structure for high frequency transmission. However, in general, a sheet with a thickness of at most 1 mm may be readily formed, and further the thickness of the layer may be arbitrary determined according to the presence or absence of an electrode. Organic receiving piezoelectric layer 1 may be prepared by laminating an organic polymer sheet in the same manner as for transmitting piezoelectric layer 3. In this case, it is possible to form a part of receiving piezoelectric layer 1 by laminating only a polymer sheet without the printing process of the electrode layer using platinum paste, or, alternatively, it is also possible to insert the electrode layer into the laminate by pre-printing as shown in FIG. 1. Dielectric layer 4 is mounted on receiving piezoelectric layer 1. In FIG. 1, numeral "5" represents an electrode for applying voltage.

(Dielectric Layers)

Dielectric substances employed in dielectric layers of the present invention may include various organic resins, fired inorganic materials, mica, and oil, those of which have a high dielectric constant and a wide band gap, and behave as direct current insulators. The generation of dielectricity is due to the formation of electric dipoles in a dielectric substance, which causes the polarization of the substance. Polarization is classified into electronic polarization, ionic polarization, orientation polarization, and space charge polarization, any of which is included in the present invention. Although it is impossible for electrons to move freely in a dielectric substance, atoms and molecules in the same are divided into a positively charged part and a negatively charged part by applying an electric field to the dielectric substance from outside of the same. Orientation polarization occurs in cases in which molecules forming a dielectric substance exhibit polarity. In cases in which no electric field is applied, a dielectric substance has no electric dipoles as a whole since the molecules are oriented at random. However, once an electric field is applied, the dipoles are generated due to subsequent molecular orientation. Further, when an electric field is applied for a sufficiently long period of time, the electric dipoles are generated due to charge carrier movement in the dielectric substance. In the present invention, it becomes possible to carry out a high-voltage direct current treatment or a high-voltage alternating current treatment as well as a high-voltage corona discharge treatment of the organic piezoelectric layer with providing such a dielectric substance on the organic piezoelectric element of the present invention. In FIG. 2, numeral "6" represents an electrode for the corona discharge treatment.

As preferable thin piezoelectric films used in piezoelectric layers of the present invention, thin films exhibiting excellent thermostability and voltage endurance. Examples thereof include resins prepared from polyvinyl butyral, polyolefin, polycycloolefin, polyacrylate, polyamide, polyimide, polyester, polysulfone, silicone, and derivatives thereof. A typical example of polyvinyl butyral includes (6)-708 (CAS No. 63148-65-2) listed as an existing chemical substance under the Law Concerning the Examination and Regulation of Manufacturing, etc. of Chemical Substances. Examples of polyamide include polyamide 6, polyamide 66, polyamide 610, polyamide 612, polyamide MXD6, polyamide 11, polyamide 12, polyamide 46, methoxylated polyamide (existing chemical substance (7)-383). Example of polyimide includes Existing Chemical Substance No. (7)-2211 (CAS No. 611-79-0) developed by NASA. Examples of silicone include Existing Chemical Substance Nos. (7)-476, (7)-474, (7)-477, (7)-483, and (7)-485.

Further, examples of epoxy compounds as the above materials include a polyphenyl type, a polyglycidyl amine type, an alcohol type, and an ester type, but an alicyclic type such as existing chemical substances Nos. 3-2452, 3-3453, 4-47, or 5-1052 is specifically preferable. The alicyclic type may preferably be employed due to its excellent thermostability and adhesion force.

Further, detailed examples of the above materials include thin films of olefin resins such as polyethylene, polypropylene and α-polyolefin; thin films of synthetic resins such as polyester, polystyrene, polyfluorovinylidene, polycarbonate, tetrafluoroethylene, polyphenylene sulfide, polychlorovinyl, and polychlorovinylidene; copolymers and blended forming substances of at least two kinds thereof; and nonpolar glass sheets. To increase the dielectric constant of the above dielectric thin layers, fine particles of inorganic dielectric materials may be incorporated. Materials used in inorganic piezoelectric elements, to be described below, are exemplified as such fine particles.

The used amount of these reins is appropriately selected in conjunction with specified sensitivity and frequency characteristics, but is in the range of 10 nm-200 μm in terms of film thickness, but is preferably in the range of 50-150 μm.

With regard to usable methods, these resins may be utilized by dissolving them in solvents such as DMSO, DMF, DME, acetone, or methyl ethyl ketone, or mixed solvents thereof, and also by heat-melting bulk resins via heating them to their respective melting point without using any solvents.

(Transmitting Piezoelectric Layers and Receiving Piezoelectric Layers)

It is preferable to select appropriately impedance of any transmitting piezoelectric layer and a receiving piezoelectric layer. Further, after preparation by firing and polarization, in accordance with a method of laminating a green sheet, a transmitting piezoelectric layer may be polarized by coating a receiving piezoelectric layer. Further, it is possible to make an adhesion structure, wherein a laminated sheet, which has been coated, dried, and uniaxially stretched to form a sheet, is utilized as a receiving piezoelectric layer. In particular, it is possible to laminate a thin polymer film, which has been stretched uniaxially or biaxially, to achieve piezoelectric effects thereof, to be maximized in order to be used as a receiving piezoelectric layer.

(Transmitting Piezoelectric Layers)

Although PZT is frequently employed as a material for transmitting piezoelectric layers, lead-free materials have been preferred in recent years. Examples thereof include rock crystal, lithium niobate ($LiNbO_3$), potassium niobate tantalate ($K(Ta,Nb)O_3$), barium titanate ($BaTiO_3$), and lithium tantalate ($LiTaO_3$), or strontium titanate ($SrTiO_3$) and barium strontium titanate (BST). In addition, PZT is preferably $Pb(Zr1-nTix)O_3$ ($0.47 \leq n \leq 1$).

(Organic Receiving Piezoelectric Layers)

A preferred example of organic receiving piezoelectric layers includes a copolymer of fluorovinylidene/trifluoroethylene, being a polymer piezoelectric layer. For example, a slow cooling rate in the heat treatment process (the process that improves crystallization characteristics by applying heat at a temperature between the ferroelectric-paraelectric phase commutation point and the melting point) after coating is preferably in the range of 1-50° C./minute. It is undesirable to be less than 1° C./minute, resulting in a productivity decrease, and to be at more than 50° C./minute, resulting in requirements of large cooling facilities.

Regarding the molecular weight of a polymer raw material of an organic receiving piezoelectric layer, the polymer generally becomes a piezoelectric layer exhibiting plasticity and flexibility according to the increase of the molecular weight. With regard to either of P(VDF-TrFE) or P(VDF-TeFE), thin films employed in piezoelectric layers exhibiting high sensitivity may be obtained by using polymer piezoelectric substances with a melt flow rate of at most 0.03 g/min at 230° C., preferably at most 0.02 g/min, and more preferably 0.01 g/min, wherein VDF represents fluorovinylidene, TrFE represents trifluoroethylene, and TeFE represents tetrafluoroethylene.

On the other hand, regarding fluorovinylidene/trifluoroethylene, since electromechanical coupling constants (piezoelectric effects) vary in the thickness direction according to copolymerization ratios, the copolymerization ratio of the former, for example, is preferably in the range of 60-99 mol %. However, the optimal value varies depending on using methods of the organic adhesive medium used in laminating an inorganic transmitting piezoelectric layer and an organic receiving piezoelectric layer. The most preferred copolymerization ratio of the former, as described above, is in the range of 85-99 mol %. A polymer prepared from fluorovinylidene in the range of 85-99 mol %, and perfluoroalkyl vinyl ether, perfluoroalkoxy ethylene, or perfluorohexaethylene in the range of 1-15 mol % tends to increase sensitivity of high frequency reception due to control of the transmitted fundamental wave in combination of an inorganic transmitting piezoelectric layer and an organic receiving piezoelectric layer. Although tetrafluoroethylene and trifluoroethylene have conventionally been preferred, perfluoroalkyl vinyl ether (PFA), perfluoroalkoxy ethylene (PAE), and perfluorohexaethylene may be employed in composite elements of the present invention.

Synthesis of polymers for the organic receiving piezoelectric layer of the present invention are performed employing a radical polymerization method in which copolymerization is performed employing several kinds of monomers, a method which performs photopolymerization employing photo-sensitizers, or a vapor deposition polymerization method in which a thin layer is formed while vaporizing monomers at a relatively low temperature under a relatively low pressure ambience. In the present invention, it is possible to select any of the above appropriate polymerization methods depending on the monomer type and the copolymerization composition ratio. In the case of polyurea, which is employed in organic receiving piezoelectric layer as one of the preferable embodiments, it is preferable to employ the vapor deposition polymerization method. Polymer structures for polyurea may be represented by Formula $(—NH—R—CO)_n$ wherein R may include an alkylene group, an phenylene group, a divalent heterocyclic group, and a heterocyclyl group, each of which may be substituted with any of the substituents. Polyurea may be a copolymer of urea derivatives with other monomers. Preferred polyurea may include aromatic polyurea which employs 4,4'-diaminophenylmethane (MDA) or 4,4'-diphenylmethane diisocyanate (MDI).

(Close Contact of Organic Receiving Piezoelectric Layer with Dielectric Layer)

In the present invention, "peelable" means detachable later provided prior to a polarization treatment. The dielectric layer is eventually not needed in the transducer.

Methods to bring the organic receiving piezo-electric layer (the polymer piezoelectric layer) into close contact with the dielectric layer (the dielectric film) include close pressurized contact and close contact via adhesives. In order to realize desired peeling properties, a method is available in which a highly peelable dielectric film is employed, or it is also possible to realize close contact in such a manner that the dielectric film is allowed to adhere, employing hot-melt crosslinking agents which are capable of being peeled. However, close contact via pressure is preferred since thereby the surface of the dielectric film after peeling to be clean. Applied pressure may be set in the range of 1 Pa-1 GPa. Applied pressure is preferably at most 1 GPa in terms of facilities since no special pressing means is needed. Further, the pressure is preferably at least 11 Pa, since thereby sufficiently close contact is achieved. In terms of production, pressure is more preferably 1 kPa-1 MPa.

(Polarization Treatment)

In the polarization treatment according to the present invention, it is preferable to achieve it so that polarization achieves maximum. It is possible to result in polarization via a direct or alternating current voltage applying treatment or a corona discharge treatment. Efficient formation of such polarization distribution state differs depending on temperature.

When a polarization treatment is applied to a piezoelectric polymer film (being an organic receiving piezoelectric layer) employing the direct or alternating voltage application treatment or the corona discharge treatment, the unit treatment rate is preferably 1-1,000 $kW/m^2$. When it is at least 1 $kW/m^2$, the polarization treatment is affected and when it is at most 1,000 kW/m², no dielectric breakdown results due to dielectric heating. However, the above unit treatment rate is more preferably 50 W/m²-900 kW/m², but is most preferably 100 W/m²-100 kW/m². Voltage is preferably 1 V/m-10 MV/m, but is more preferably 1 kV/m-1 MV/m. Frequency of alternating current is preferably 10 Hz-100 MHz, is more preferably 100 Hz-40 MHz, but is still more preferably 1 kHz-30 MHz. Current density is preferably 0.1 mA-100 A, but is more preferably 1 mA-10 A.

Compared to the continuous voltage application, in the case of pulse voltage application, high voltage may be applied since the application duration is relatively short. The rate of the direct or alternating current voltage application treatment and the corona discharge treatment is represented by value (Wp/(L×V)) which is obtained by dividing output Wp by the product of electrode length L of each apparatus by processing rate V m/minute. Voltage of the organic receiving piezoelectric layer per unit length of direct or alternating current is preferably in the range of 1-1 GV/m, is more preferably in the range of 100 V/m-10 MV/m, but is still more preferably in the range of 1 kV/m-1 MV/m. The voltage range is preferably at most the upper limit since no breakage occurs to the organic piezoelectric film even in the presence of dielectrics. Further, the voltage range is preferably at least the lower limit since polarization expression results. Polarization treatment duration is commonly 1 second-12 hours, while considering working processes, it is commonly 1 second-3 hours, is preferably within one hour, but is still more preferably within 10 minutes.

EXAMPLES

The present invention will now be detailed with reference to examples, however the present invention is not limited thereto.

Example 1

<<Preparation of Transmission Piezoelectric Layer>>
<Film S1: Preparation of Titanate Based Piezoelectric Layer Incorporating No Lead>

$CaCO_3$, $La_2O_3$, $Bi_2O_3$, and $TiO_2$ as a component raw material, as well as MnO as a by-component raw material were prepared. Each of the component raw materials was weighed so that the final composition became $(Ca_{0.97}La_{0.03})Bi_{4.01}Ti_4O_{15}$. Subsequently, pure water was added and the resulting mixture was blended over 8 hours employing a ball mill using zirconia medium, followed by completely drying, whereby a mixed powder was prepared. The resulting mixed powder was subjected to temporary molding, and temporary firing at 800° C. for two hours, whereby a temporary fired product was prepared. Subsequently, pure water was added to the resulting temporary fired product, and pulverization was carried out employing a ball mill in which zirconia media were added in pure water, followed by drying, whereby a piezoelectric ceramics raw material powder was prepared. During pulverization, by controlling the pulverization period and the pulverizing conditions, the piezoelectric ceramics raw material powder having a diameter of 100 nm was prepared. Added to the piezoelectric ceramics raw material powder was 6% by weight of pure water as a binder and the resulting mixture was press-molded to form a 100 μm thick temporary plate-like mold. The resulting temporary plate-like mold was subjected to vacuum packing, and subsequently was press molded at a pressure of 235 Mpa. Subsequently, the above molded product was fired. A final fired product at a thickness of 20 μm was obtained. The firing temperatures was 1,100° C. A polarization treatment was carried out by applying an electric field of 1.5 (MV/m) or more for one minute.
<Film S2: Preparation of Piezoelectric Layer PZT>

PZT, as employed in the present invention, is one in which components of lead, zirconium, and titanium are in the range specified by formula $Pb(Zr_{1-n}Ti_n)O_3$ ($0.47 \leq n \leq 1$). Herein, PZT at 0.2 n of was prepared. Each of the oxides was weighed and then pure water was added. The resulting mixture was blended for 8 hours in pure water employing a ball mill into which zirconia media were placed, followed by sufficient drying, whereby a mixed powder was prepared. The resulting mixed powder was subjected to temporary molding and then to temporary firing in ambient air at 200° C. for two hours, whereby a temporary fired product was prepared. Subsequently, pure water was added to the resulting temporary fired product. The resulting mixture was pulverized in pure water employing a ball mill into which zirconia media were placed. Thereafter, drying was carried out, whereby a piezoelectric ceramic raw material powder was prepared. Added as a binder was 6% by weight of pure water to the piezoelectric ceramic raw material powder, and the resulting mixture was subjected to press molding to form a 530 μm thick plate-like temporary molded product. The resulting plate-like temporary molded product was subjected to vacuum-packing, followed by press molding at a pressure of 235 MPa. Subsequently, the resulting molded product was fired and as a final fired product, a 41 μm thick fired product was prepared. The firing temperature was 780° C. Polarization was conducted via application of an electric field of 1.5 (MV/m) or more for one minute.

<<Preparation of Receiving Piezoelectric Layer>>
<Preparation of Film M1>

A DMF (dimethylformamide) solution of P(VDF-PFA) (at a mol ratio of VDF/perfluoroalkyl vinyl ether of 90/20) was cast into a film to result in a thickness of 100 μm, followed by crystallization at 140° C.

<Preparation of Film M2>

A DMF (dimethylformamide)/acetone solution of P(VDF-TrE) (at a mol ratio of VDF/trifluoroethylene of 75/25) was cast into a film to result in a thickness of 100 μm, followed by crystallization at 140° C.

<Preparation of Film M3>

A DMF (dimethylformamide) solution of P(VDF/HFP) (at a mol ratio of VDF/HFP (hexatrifluoropropylene of 86/12) was cast into a film to result in a thickness of 100 μm, followed by crystallization at 138° C.

<Preparation of Film M4>

A film of P(VDF-HFP) (at a mol ratio of VDF/HFP (hexafluoropropylene of 86/12) was dissolved in a DMF (dimethylformamide) solution and 3% by weight of carbon nanotube was further added. The resulting mixture was kneaded employing a blender and cast, whereby a 100 μm thick film was prepared.

<Preparation of Film M5>

Selected as a monomer were 4,4'-diaminophenylmethane (MDA) and 4,4'-diphenylmethanediisocyanate (MDI) which then underwent deposition polymerization. MDA was placed on a boat in a vacuum chamber at $2 \times 10^{-3}$ Pa and heated to 100° C. MDI was heated to 66° C. in the vacuum chamber. MDA and MDI were subjected to vapor deposition onto the above previously prepared transmitting piezoelectric layer (Film S2, surface DI ratio was 1.1) to form Film M5 (thickness of 20 μm). The MDA/MDI ratio in the obtained Film M5 was 1/1.

Each of above transmitting piezoelectric layers (Films S1 and S2), which had been molded, was subjected to attachment of an electrode, followed by baking, and then subjected to a polarization treatment (at a voltage of 1 MV). Further, one of the above receiving piezoelectric layers (Films M1-M4) was laminated onto the above transmitting piezoelectric layer to result in the combination listed in Tables 1 and 2, and was allowed to adhere to each other by applying pressure, whereby a "composite sample which was prepared by applying the receiving piezoelectric layer onto a transmitting piezoelectric layer having therebetween a electrode layer (an ultrasound probe)" was prepared.

<<Preparation of Dielectric Layer>>

Preparation of Dielectric Film U

After adding 36% by weight of above PZT (at n of 0.25) which had been fired and pulverized to result in an average particle diameter of 0.3 μm to a solution of P(VDF-TrE-TeE) (at a mol ratio of VDF/trifluorianted ethylene/tetrafluorionated ethylene of 70/20/10) dissolved in a DMF (dimethylformamide)/acetone mixed solution, the mixture was cast into a film of a dried film thickness of 100 μm.

The dielectric layer (Dielectric Film U), prepared as above, was adhered at pressure of 5 MPa onto the receiving piezoelectric layer of the above "composite sample which was prepared by applying the receiving piezoelectric layer onto a transmitting piezoelectric layer via an electrode layer (an ultrasound probe)", whereby the dielectric layer capable of being peeled, according to the present invention, was applied.

Figure 2:
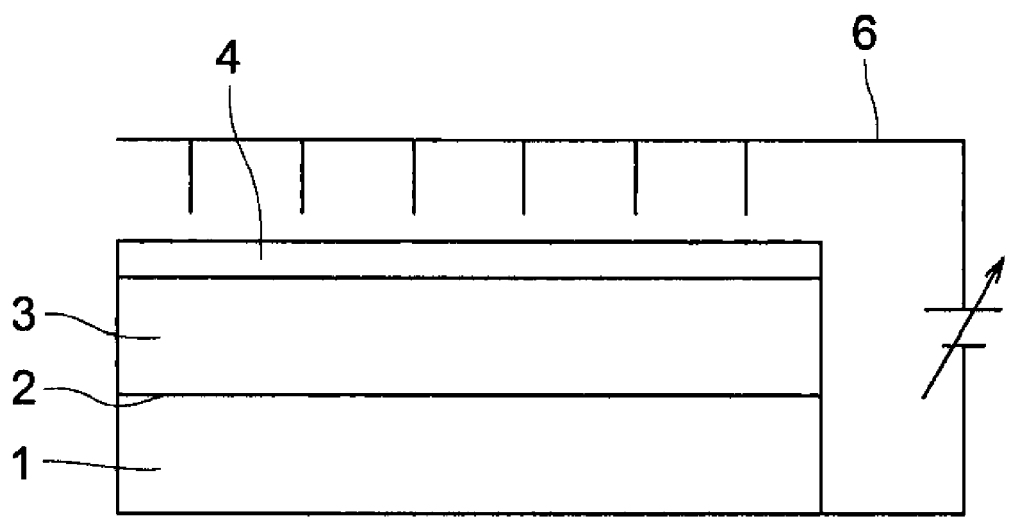
FIG. 2 is a schematic view showing a polarization treatment in which corona discharge treatment is applied to a probe having a plurality of layers and provided with a dielectric layer.

Thereafter, under conditions (voltage application methods) listed in Tables 1 and 2, application was carried out as shown in FIGS. 1 and 2, and the polarization treatment was performed.

Further employed as each of the power sources for a direct and alternating high voltage polarization treatment was each of the following power sources. Namely employed as direct current high voltage power source was HDV-100 K1US (1-100 kV), produced by Pulse Electronic Engineering Co., Ltd., while employed as the alternating current power source was KAC 15-5 VA (0-15 kV and 5 mA), produced by Kasuga Electric Works Ltd. Employed as a high voltage alternating current pulse generator was PG-3K02 (at a voltage of 1-3 kV, a pulse width of 2-20 μS, and a repeat frequency of 10-100 Hz), and employed for the corona discharge treatment was CT-0112, (at an output of 1 kW, an employed frequency of 35 kHz, and a discharge exposure amount unit of $W/(m^2/min)$, produced by Kasuga Electric Works Ltd.

After the polarization treatment, the dielectric layer was slowly peeled off. Thereafter, Ultrasound probe Samples 101-141 (listed in Tables 1 and 2) were prepared by arranging a metal electrode on the external surface of the organic piezoelectric layer via vapor deposition. Subsequently, basic frequency f1 at 7.5 MHz was transmitted, and a receiving relative sensitivity (which was obtained by multiplying a constant to the ratio of the transmitting voltage to the receiving voltage) at 15 MHz as receiving high harmonic wave f2, was obtained.

The receiving relative sensitivity was determined employing a sound intensity determining system Model 805 (1-50 MHz) a product of Sonora Medical System, Inc., 202 Miller Drive Longmont, Colo. 0501 U.S.A.

Further, during the determination, a matching layer was adhered onto an organic piezoelectric layer at a thickness of 1μ, employing an epoxy adhesive, while the backing layer was adhered to the inorganic piezoelectric layer at a thickness of 1μ, using the same adhesive.

Tables 1 and 2 each show the above described results.

TABLE 1

Ultrasonic Detecting Element

| | Piezoelectric Layer Structure | | Dielectric | Polarization Treatment (Voltage Application Method) | | | | | | |
|---|---|---|---|---|---|---|---|---|---|---|
| | Transmitting Piezo- | Receiving Piezo- | Layer Dielectric | Direct | Direct Current Pulse Wave Application | | | | | |
| Sample No. | electric Layer (Film) | electric Layer (Film) | Film U (absence or presence) | Current Application $(W/m^2/min)$ | $(W/m^2/min)$ | Pulse Width (μsec) | Repeating Frequency (Hz) | *1 | *2 | Evaluation Relative Sensitivity | Remarks |
| 101 | S2 | M5 | absence | 120 W | — | — | — | — | — | 50 | Comp. |
| 102 | S2 | M5 | absence | 800 W | — | — | — | — | — | 70 | Comp. |
| 103 | S2 | M5 | absence | 120 kW | — | — | — | — | — | 80 | Comp. |
| 104 | S2 | M5 | absence | 860 kW | — | — | — | — | — | 70 | Comp. |
| 105 | S2 | M5 | absence | 1240 kW | — | — | — | — | — | 60 | Comp. |
| 106 | S2 | M5 | presence | 120 W | — | — | — | — | — | 105 | Inv. |
| 107 | S2 | M5 | presence | 800 W | — | — | — | — | — | 130 | Inv. |
| 108 | S2 | M5 | presence | 120 kW | — | — | — | — | — | 140 | Inv. |
| 109 | S2 | M5 | presence | 860 kW | — | — | — | — | — | 150 | Inv. |
| 110 | S2 | M5 | presence | 1240 kW | — | — | — | — | — | 160 | Inv. |
| 111 | S2 | M4 | absence | — | 120 W | 12 | 80 | — | — | 55 | Comp. |
| 112 | S2 | M4 | absence | — | 800 W | 12 | 80 | — | — | 67 | Comp. |
| 113 | S2 | M4 | absence | — | 120 kW | 12 | 80 | — | — | 70 | Comp. |
| 114 | S2 | M4 | absence | — | 860 kW | 7 | 80 | — | — | 72 | Comp. |
| 115 | S2 | M4 | absence | — | 1240 kW | 3 | 80 | — | — | 63 | Comp. |
| 116 | S2 | M4 | presence | — | 120 W | 13 | 80 | — | — | 110 | Inv. |
| 117 | S2 | M4 | presence | — | 800 W | 13 | 80 | — | — | 125 | Inv. |
| 118 | S2 | M4 | presence | — | 120 kW | 13 | 80 | — | — | 136 | Inv. |
| 119 | S2 | M4 | presence | — | 860 kW | 8 | 80 | — | — | 140 | Inv. |
| 120 | S2 | M4 | presence | — | 1240 kW | 3 | 80 | — | — | 150 | Inv. |

Comp.: Comparative Example,
Inv.: Present Invention,
*1: Alternating Current Application $(W/m^2/min)$,
*2: Corona Discharge Treatment $(W/m^2/min)$

TABLE 2

Ultrasonic Detecting Element

| Sample No. | Piezoelectric Layer Structure | | Dielectric Layer | Polarization Treatment (Voltage Application Method) | | | | | | | | |
|---|---|---|---|---|---|---|---|---|---|---|---|---|
| | Transmitting Piezoelectric Layer (Film) | Receiving Piezoelectric Layer (Film) | Dielectric Film U (absence or presence) | *1 | Direct Current Pulse Wave Application | | | | Corona Discharge Treatment ($W/m^2/min$) | Evaluation Relative Sensitivity | Remarks |
| | | | | | (W/$m^2$/min) | Pulse Width (μsec) | Repeating Frequency (Hz) | *2 | | | |
| 121 | S2 | M3 | absence | — | — | — | — | 120 W | — | 54 | Comp. |
| 122 | S2 | M3 | absence | — | — | — | — | 800 W | — | 64 | Comp. |
| 123 | S2 | M3 | absence | — | — | — | — | 120 kW | — | 72 | Comp. |
| 124 | S2 | M3 | absence | — | — | — | — | 860 kW | — | 72 | Comp. |
| 125 | S2 | M3 | absence | — | — | — | — | 1240 kW | — | 63 | Comp. |
| 126 | S2 | M3 | presence | — | — | — | — | 120 W | — | 106 | Inv. |
| 127 | S2 | M3 | presence | — | — | — | — | 800 W | — | 109 | Inv. |
| 128 | S2 | M3 | presence | — | — | — | — | 120 kW | — | 119 | Inv. |
| 129 | S2 | M3 | presence | — | — | — | — | 860 kW | — | 126 | Inv. |
| 130 | S2 | M3 | presence | — | — | — | — | 1240 kW | — | 136 | Inv. |
| 131 | S1 | M2 | absence | — | — | — | — | — | 120 W | 56 | Comp. |
| 132 | S1 | M2 | absence | — | — | — | — | — | 800 W | 66 | Comp. |
| 133 | S1 | M2 | absence | — | — | — | — | — | 120 kW | 72 | Comp. |
| 134 | S1 | M2 | absence | — | — | — | — | — | 860 kW | 80 | Comp. |
| 135 | S1 | M2 | absence | — | — | — | — | — | 1240 kW | 72 | Comp. |
| 136 | S1 | M2 | presence | — | — | — | — | — | 120 W | 112 | Inv. |
| 137 | S1 | M2 | presence | — | — | — | — | — | 800 W | 121 | Inv. |
| 138 | S1 | M2 | presence | — | — | — | — | — | 120 kW | 131 | Inv. |
| 139 | S1 | M2 | presence | — | — | — | — | — | 860 kW | 140 | Inv. |
| 140 | S1 | M2 | presence | — | — | — | — | — | 1240 kW | 148 | Inv. |
| 141 | S2 | M1 | presence | — | — | — | — | — | 1 kW | 123 | Inv. |

Comp.: Comparative Example,
Inv.: Present Invention,
*1: Direct Current Application (W/$m^2$/min),
*2: Alternating Current Application (W/$m^2$/min)

As can be clearly seen from Tables 1 and 2, the samples of the present invention exhibit excellent relative sensitivity.

As noted above, based on the present invention, it is found that even though the ultrasound probe, which is a composite of an inorganic transmitting piezoelectric element and a receiving organic piezoelectric element, is subjected to a polarization treatment, it is possible to enhance sensitivity without insulation breakdown.

Based on the present invention, it is found that in an ultrasound probe having thereon the transmitting piezoelectric layer and the receiving piezoelectric layer in the above order, which transmits and receives ultrasonic waves, by allowing the receiving piezoelectric layer, particularly an organic receiving piezoelectric layer, to undergo appropriate and stable polarization treatment and polarization at low cost without insulation breakdown, it is possible to provide an ultrasound probe which specifically exhibits excellent sensitivity. Further, it is found that it is possible to provide a production method of ultrasound probes of excellent sensitivity, which enables performance stability, easiness, high yield, and low cost.

What is claimed is:

1. A method of manufacturing an ultrasound probe comprising sequential steps of:
    laminating an electrode layer on a transmitting piezoelectric layer;
    polarizing the transmitting piezoelectric layer;
    laminating a receiving piezoelectric layer on the electrode layer;
    providing a peelable dielectric layer on the receiving piezoelectric layer;
    polarizing the receiving piezoelectric layer; and
    peeling the dielectric layer from the receiving piezoelectric layer to obtain the ultrasound probe,
    the ultrasound probe transmitting and receiving an ultrasound.

2. The method of claim 1, wherein the dielectric layer comprises an organic material and inorganic dielectric particles.

3. The method of claim 2, wherein the inorganic dielectric particles are selected from the group consisting of: quartz, $LiNbO_3$, $K(Ta,Nb)O_3$, $BaTiO_3$, $LiTaO_3$ and $SrTiO_3$.

4. The method of claim 1, wherein the transmitting piezoelectric layer comprises an inorganic material, and the receiving piezoelectric layer comprises an organic material.

5. The method of claim 1, wherein the polarization treatment is a direct current high voltage pulse application at 1 kV/m-1 MV/m or an alternating current high voltage pulse application at 1 kV/m-1 MV/m.

6. The method of claim 1, wherein the polarization treatment is a corona discharge treatment.

* * * * *